United States Patent [19]

Pascucci et al.

[11] Patent Number: 5,644,529
[45] Date of Patent: Jul. 1, 1997

[54] INTEGRATED CIRCUIT FOR THE PROGRAMMING OF A MEMORY CELL IN A NON-VOLATILE MEMORY REGISTER

[75] Inventors: Luigi Pascucci, Sesto San Giovanni; Silvia Padoan, Rimini, both of Italy

[73] Assignee: SGS-Thomson Microelectronics S.r.l., Agrate Brianza, Italy

[21] Appl. No.: 635,455

[22] Filed: Apr. 18, 1996

Related U.S. Application Data

[63] Continuation of Ser. No. 347,267, Nov. 30, 1994, abandoned.

[30] Foreign Application Priority Data

Nov. 30, 1993 [EP] European Pat. Off. ............ 93830474

[51] Int. Cl.$^6$ ............................................ G11C 11/40
[52] U.S. Cl. ............................ 365/185.05; 365/185.07; 365/200
[58] Field of Search ........................ 365/185, 200, 365/49, 154, 185.05, 185.07

[56] References Cited

U.S. PATENT DOCUMENTS

| | | | |
|---|---|---|---|
| 4,347,483 | 8/1982 | Torimatu | 365/185 |
| 4,546,454 | 10/1985 | Gupta et al. | 365/185 |
| 4,580,247 | 4/1986 | Adam | 365/185 |
| 5,251,169 | 10/1993 | Josephson | 365/185 |

OTHER PUBLICATIONS

Cioaca, Dumitru et al., "A Million-Cycle CMOS 256K EEPROM," *IEEE Journal of Solid-State Circuits*, SC-22(5):684–692, Oct. 1987.

Vancu, Radu et al., "THAM 10.5: A 30ns Fault Tolerant 16K CMOS EEPROM," IEEE International Solid State Circuits Conference, New York, Feb. 1988, vol. 31, pp. 128–129, and 328.

Umezawa, Akira et al., "A 5-V-Only Operation 0.6 μm Flash EEPROM with Row Decoder Scheme in Triple-Well Structure," *IEEE Journal of Solid-State Circuits* 27(11):1540–1545, Nov. 1992.

*Primary Examiner*—David C. Nelms
*Assistant Examiner*—Vu A. Le
*Attorney, Agent, or Firm*—David V. Carlson; Seed and Berry LLP

[57] ABSTRACT

In an integrated circuit for programming a memory cell in a non-volatile memory register which is associated with a memory matrix wherein the non-volatile memory register is used to store a redundancy address, the memory cell has at least one programmable non-volatile memory element having a control electrode and a data electrode and is suitable to store one bit of information. A load circuit associated to the memory element reads the information stored therein. The integrated circuit has switching means connected in series between the data electrode and a respective address signal line of an address signal bus which also supplies a decoding circuitry of the memory matrix. The switching means are controlled by a signal which determines the switching means to electrically connect the data electrode of the memory element to the address signal line when the memory cell of the non-volatile memory register is to be programmed, and to electrically disconnect the data electrode of the memory element from the address signal line when the information stored in the memory element is to be read by the load circuit.

31 Claims, 1 Drawing Sheet

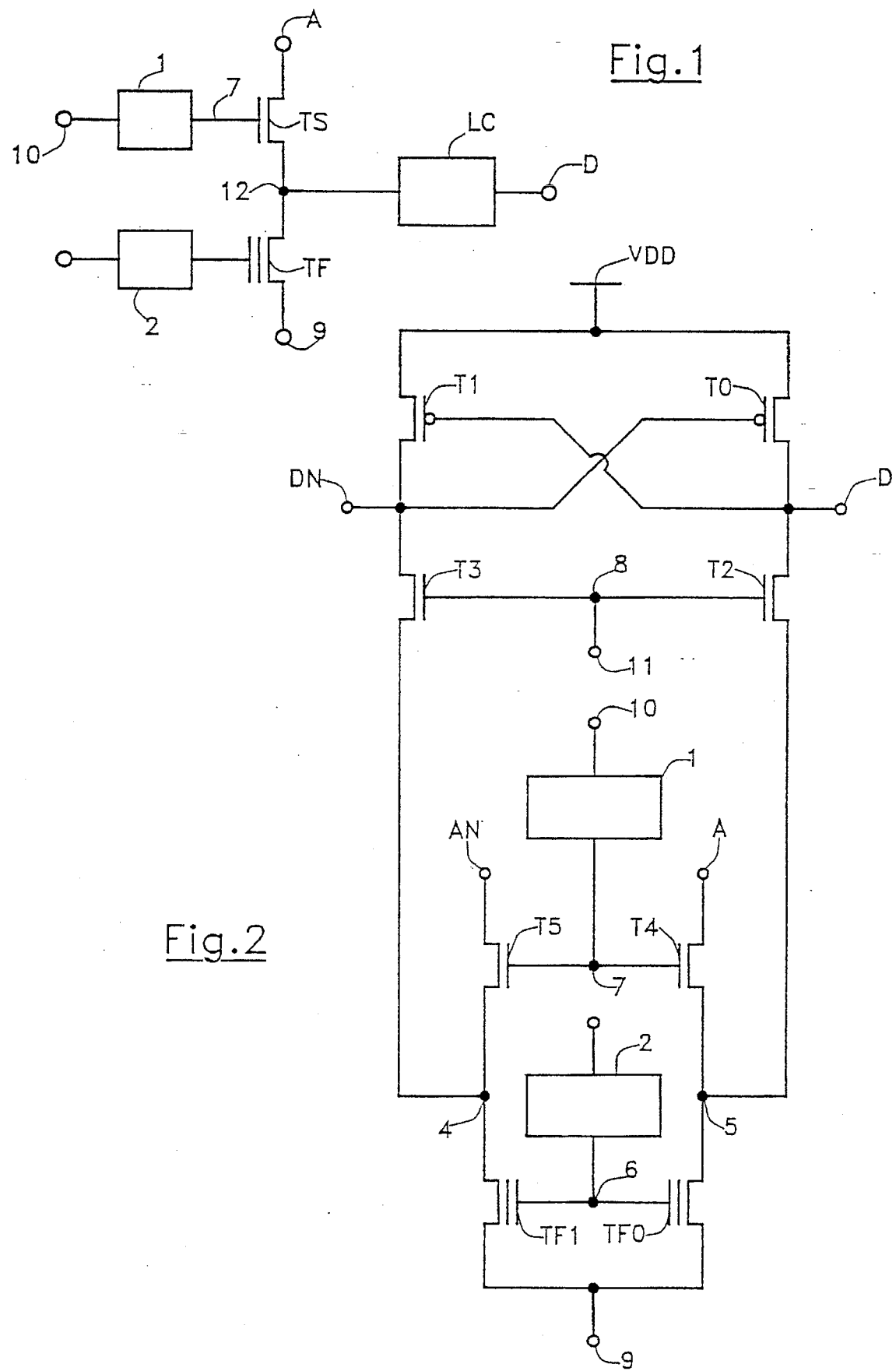

INTEGRATED CIRCUIT FOR THE PROGRAMMING OF A MEMORY CELL IN A NON-VOLATILE MEMORY REGISTER

CROSS-REFERENCE TO RELATED APPLICATION

This application is a continuation of U.S. patent application Ser. No. 08/347,267, filed Nov. 30, 1994, now abandoned.

TECHNICAL FIELD

The present invention relates to an integrated circuit for the programming of a memory cell in a non-volatile memory register.

BACKGROUND OF THE INVENTION

Non-volatile memory registers are commonly used in memory device chips to implement redundancy. In such applications, address configurations corresponding to defective memory elements in the memory array of the memory device are stored in said non-volatile registers during the in-factory device testing, so that the defective memory elements can be replaced by redundant memory elements. In this way the manufacturing process yield is greatly improved. The memory registers must be non-volatile, since they must retain the information stored therein even in absence of the power supply, and not accessible to the end user. Depending on the particular kind of memory device, and on the manufacturing process, fuses or electrically programmable MOS transistors may be utilized as non-volatile memory elements for the memory registers.

In general, redundancy provides for the existence of both rows and columns of redundant memory elements; each redundant row or column has an associated non-volatile register. A defective memory element in the memory matrix can be replaced by a redundant memory element by substituting either the matrix row or matrix column to which it belongs with a redundant row or column, respectively; this requires that the defective row or column address is stored during testing in a non-volatile register, which, in consequence, must be made up of a number of cells equal to the number of bits in the row or column address bus.

During the memory device operation, each non-volatile memory register performs a comparison between the address configuration stored in it and the address currently supplied to the memory device and, if a matching occurs, the selection of the defective row or column is inhibited and in substitution the selection of the redundant row or column is enabled.

According to a known technique of implementing redundancy in a Flash EEPROM device, each register cell comprises two programmable non-volatile memory elements, represented by two electrically erasable and programmable MOS transistors, connected to respective load transistors in latch configuration. The register cell further comprises a program load circuit comprising two pairs of selection transistors, the transistors in each pair being connected in series between a high voltage supply and a respective programmable MOS transistor. A first transistor in each pair is controlled by a first signal, supplied in common to all the cells of all the non-volatile memory registers, which is normally at the ground level, but when during the device testing a defective memory element is found is raised to the high voltage supply value to enable the programming of the programmable MOS transistors of the non-volatile registers.

A second transistor in each pair is instead controlled by a selection signal which is used to select one particular non-volatile memory register among all those available, so that only the programmable MOS transistors of the selected memory register are programmed to store a particular address configuration corresponding to a defective matrix row or column. The control gates of the programmable MOS transistors in each register cell are controlled by two signals, one of which is the logical complement of the other, which during programming are connected either to ground or to the high voltage supply depending on the logical state of the bit of the address configuration which must be stored in the register cell.

In other words, when the logical state of an address bit is to be memorized into the register cell, each programmable MOS transistor is connected to a high voltage supply through selection transistors, and the datum to be programmed is translated into a voltage applied to the control gate of the programmable MOS transistor: if the datum is a logical "0", the control gate potential is raised to, let's say, 12 V, while if the datum is a logical "1", the control gate potential is kept to the ground level.

A register cell architecture such as that described above has some disadvantages: first of all it is necessary to supply said first signal, connected to the output of a ground/high-voltage switch, to all the cells of all the non-volatile memory registers; secondly, a number of different selection signals corresponding to the number of non-volatile memory registers must be generated, so that in each register a different address configuration can be programmed; thirdly, it is necessary to generate two complementary signals for each register cell to drive the control gates of the programmable MOS transistors. Furthermore, to prevent the programming current of the programmable MOS transistors from being reduced, the transistors in the program load circuit must be highly conductive, and occupy a significant area. Finally, it would be desirable to reduce the number of transistors of each program load circuit.

SUMMARY OF THE INVENTION

An object of the present invention is to provide a circuit for the programming of a memory cell of a non-volatile memory register which is not affected by the above-mentioned drawbacks.

According to the present invention, such object is attained by means of an integrated circuit for the programming of a memory cell in a non-volatile memory register, said memory cell comprising at least one programmable non-volatile memory element having a control electrode and a data electrode and being suitable to store one bit of information, and a load circuit associated to said memory element to read the information stored therein, characterized in that it comprises switching means, connected in series between the data electrode of said at least one memory element and a respective data line carrying a datum to be programmed into said memory element, said switching means being controlled by a signal which determines the switching means to electrically connect the memory element to the data line when the memory cell of the non-volatile memory register is to be programmed.

In other words, if for example the programmable memory element is represented by a programmable floating-gate MOS transistor, the datum to be memorized is translated into a voltage which is applied to the data electrode of the floating-gate MOS transistor, instead of to the control electrode (i.e., the control gate) as in the known art.

Thanks to the present invention, the programming circuit is greatly simplified, the number of transistors required is minimized, and the area occupied by the circuit is therefore reduced. The number of signals required to perform the programming of a particular memory register among the others available is also reduced. It is also made possible to use as data lines signal lines already present in the memory device, such as the address signal lines supplying the decoding circuitry of the memory device.

The features of the present invention shall be made more evident by the following detailed description of two particular embodiments, described as non-limiting examples of the present invention.

BRIEF DESCRIPTION OF THE DRAWINGS

FIG. 1 is a schematic diagram of a first type of memory cell of a non-volatile memory register, with a programming circuit according to a first embodiment of the present invention.

FIG. 2 is a schematic diagram of a second type of memory cell of a non-volatile memory register, with a programming circuit according to a second embodiment of the invention.

DETAILED DESCRIPTION OF THE INVENTION

A non-volatile memory register suitable for example to store an address configuration corresponding to a defective row or column of a memory matrix of a memory device, for example a Flash EEPROM, comprises a number of memory cells corresponding to the number of row or column address bits in the memory device address bus.

In its simplest form, shown in FIG. 1, each register cell comprises an electrically erasable and programmable floating-gate transistor TF, identical to those composing the memory matrix, having a source electrode connected to a source line 9, normally connected to a ground reference voltage, and a drain electrode connected to a node 12. The register cell comprises a load circuit LC connected to the node 12 and suitable to read the information stored in TF; an output D of the load circuit LC can assume two logical states depending on the information stored in TF.

The register cell also comprises switching means substantially represented by an N-channel MOSFET TS with source connected to the node 12, and drain connected to a data line A carrying the datum to be programmed into TF. The data line A corresponds to one bit of the address configuration to be programmed into the non-volatile memory register, and is already present in the memory device since it is used for decoding purposes. The use of an already existent line simplifies the circuitry and accordingly reduces the circuitry's size in the chip area. TS has a gate electrode connected to the output 7 of a first switch 1, controlled by a signal 10. TF has a control gate electrode connected to the output of a second switch 2.

Each register cell further comprises a comparison circuit (not shown) suitable to compare the datum stored in the floating gate transistor TF, represented by the voltage on node D, with the current logical value of the address bit A.

When, during testing, a defective memory element is found, the matrix row or column to which said element belongs can be substituted by a redundant row or column, provided that redundant elements are currently available. To this purpose, the address configuration of bits that normally address the defective row or column must be stored in a non-volatile register corresponding to the redundant row or column that has been chosen to replace the defective one. To program said address configuration in the selected non-volatile register, the second switch 2 raises the voltage on the control gate of the floating gate transistor TF of all the cells of all the non-volatile memory registers to a high voltage value; the selection signal 10 drives the first switch 1 to raise the gate voltage of the MOSFET TS of all the cells of the selected non-volatile memory register to the high voltage value, thus turning TS on; in the cells of the non-selected non-volatile memory registers the gate voltage of TS is instead kept low (i.e., the gate electrode of TS is connected to the ground voltage).

The floating gate transistor TF of each cell of the selected non-volatile register is therefore programmed according to the voltage value on its drain, i.e., to the logical value of the respective address bit: if for example the cell shown in the drawing is associated to an address bit which is at a logical "1" when a defective memory element is addressed, the data line A will be at a logical "1"; the logical "1" present on line A will be transferred to the drain 12 of TF, which will undergo an injection of electrons into its floating gate.

When the memory device is operated in the normal reading condition, the first switch 1 keeps the voltage on the gate electrode of TS to ground, thus keeping TS in the off state, and the second switch 2 keeps the voltage on the floating gate of TF to the usual supply value VDD. The information stored in TF is read by the load circuit LC, and supplied to the comparison circuit of the register cell.

When the exact configuration of address bits is encountered, all the cells of the non-volatile register detect the matching, and a redundant row or column is addressed instead of the defective one.

In FIG. 2 a second type of register cell is shown, comprising two electrically erasable and programmable floating gate transistors TF0 and TF1, identical to those composing the memory array, whose sources are commonly connected to the source line 9 that is normally connected to a ground reference voltage as a means for producing a reference voltage, and whose drains are connected to respective nodes 5 and 4. The register cell comprises a load circuit comprising two N-channel MOSFETs T2 and T3 with sources respectively connected to nodes 5 and 4 and drain connected to nodes D and DN; the load circuit further comprises two P-channel MOSFETs T0 and T1 whose sources are connected to a common voltage supply line VDD, and whose drains are respectively connected to the nodes D and DN. The gates of T0 and T1 are cross-connected to DN and D, respectively, so that a latch configuration is obtained. The gates of T2 and T3 are connected to a common node 8 which is driven by a bias voltage 11 suitable to limit the voltage value on the drains of the floating gate transistors TF0 and TF1.

The register cell comprises a program load circuit which comprises two N-channel MOSFETs T4 and T5 whose sources are connected to the nodes 5 and 4 respectively, and thus to the drains of the floating gate transistors TF0 and TF1, and whose drains are connected to respective programming data lines A and AN, which are already present in the memory device and used for decoding purposes. In a preferred embodiment that implements redundancy in a memory device, the programming data lines A and AN correspond to one bit A of the address configuration to be programmed, and to its logical complement AN. As already noted with reference to the first embodiment, the use of already existent lines simplifies the circuit's design. Accordingly, the overall chip area is reduced. The gates of T4 and T5 are connected to a common node 7 whose potential is controlled by the output of a first switch 1. The signal on node 7 is commonly supplied to all the memory cells of a given memory register, and allows the selection of one particular memory register among those available to store the address configuration corresponding to a defective matrix row or column. To this purpose, a number of different selection signals 10 equal to the number of distinct non-volatile memory registers must be generated. The control gates of the floating gate transistors TF0 and TF1 are both connected to a node 6 which is common to all the cells of all the non-volatile memory registers; node 6 is also connected to the output of a second switch 2.

Each register cell further comprises a comparison circuit (not shown) suitable to compare the data stored in the floating gate transistors TF0, TF1, represented by the voltages on nodes D and DN, with the logical value of the current address supplied to the memory device.

When, during testing, a defective memory element is found, the matrix row or column to which said element belongs can be substituted by a redundant row or column, provided that redundant elements are currently available. To this purpose, the address configuration of bits that normally address the defective row or column must be stored in a non-volatile register corresponding to the redundant row or column that has been chosen to replace the defective one. To program said address configuration in the selected non-volatile register, the second switch 2 raises the voltage on the control gate of the floating gate transistors TF0, TF1 of all the cells of all the non-volatile memory registers to a high voltage value; the selection signal 10 drives the first switch 1 to raise the gate voltage of the MOSFETs T4, T5 of all the cells of the selected non-volatile memory register to the high voltage value, thus turning T4 and T5 on; in the cells of the non-selected non-volatile memory registers the gate voltage of T4 and T5 is instead kept low (i.e., the gates of T4 and T5 are connected to the ground voltage).

The floating gate transistors TF0 and TF1 of each cell of the selected non-volatile register are therefore programmed according to the voltage value on their drains, i.e., to the logical value of the respective address bit: if for example the cell shown in the drawing is associated to an address bit which is at a logical "1" when a defective memory element is addressed, the data line A will be at a logical "1", while the data line AN will be at a logical "0"; the logical "1" present on line A will be transferred to the drain 5 of TF0, which will undergo an injection of electrons into its floating gate; the logical "0" present on line AN, transferred to the drain 4 of TF1, will prevent TF1 from being programmed: TF1 will remain in its original, i.e., virgin, state.

When the memory device is operated in the normal reading condition, the first switch 1 keeps the voltage on node 7 to ground, thus keeping T4 and T5 in the off state, and the second switch 2 keeps the voltage on the floating gates of TF0 and TF1 to the usual supply value VDD. The gates of T2 and T3 are biased by a voltage of about 2 V, to limit the voltage on the drains of TF0 and TF1 so that soft programming is prevented. Since TF0 has been previously programmed, it will be in the off state, and node 5 is therefore left floating; the voltage on node D raises towards VDD and causes T1 to turn off; since instead TF1 is not programmed, it will drain current, and node 4 is grounded; the voltage on node DN lowers correspondingly. The information stored in TF0 and TF1 is therefore transferred into the latch T0–T1, and supplied to the comparison circuit of the register cell.

When the exact configuration of address bits is encountered, all the cells of the non-volatile register detect the matching, and a redundant row or column is addressed instead of the defective one.

Even if the circuit according to the invention has been described with reference to its application for implementing redundancy in a Flash EEPROM device, it can also be used in general in memory cells of non-volatile memory registers; in such a case, the two data lines A and AN will no further represent the address bit associated to the register cell and its logical complement, but in general two lines carrying the data to be programmed and its logical complement.

The above-described detailed description will enable those skilled in the art to make various modifications that do not depart from the spirit and scope of the present invention. Accordingly, the present invention is not limited to the above described preferred embodiments.

We claim:

1. An integrated circuit for programming a memory cell in a non-volatile memory register which is associated with a memory matrix wherein the non-volatile memory register is used to store a redundancy address, the memory cell having at least one programmable non-volatile memory element having a control electrode and a data electrode and being suitable to store one bit of information and a load circuit associated with the memory element to read the information stored therein, the integrated circuit comprising;

switching means connected in series between the data electrode and a respective address signal line of an address signal bus which also supplies a decoding circuitry of the memory matrix, said switching means being controlled by a signal which controls said switching means to electrically connect the data electrode of the memory element to the address signal line when the memory cell of the non-volatile memory register is to be programmed and to electrically disconnect the data electrode of the memory element from the address signal line when the information stored in the memory element is to be read by the load circuit.

2. The circuit according to claim 1 wherein said memory cell comprises two programmable non-volatile memory elements, said switching means comprising a first switch connected in a series between one of said two memory elements and a first data line, and a second switch connected in series between another of said two memory elements and a second data line, said first data line and second data line carrying logically complemented data and being two address signal lines of said address signal bus of the memory matrix.

3. The circuit according to claim 2 wherein said first and second switches comprise two transistors.

4. The circuit according to claim 3 wherein said two transistors are N-channel MOSFETs.

5. The circuit according to claim 2 wherein said two programmable non-volatile memory elements are electrically programmable MOS transistors each comprising a floating gate and a control gate.

6. The circuit according to claim 5 wherein the control gates of said two programmable MOS transistors are controlled by a signal which is switched to a high voltage value during the programming of the memory cell.

7. A circuit for programming a memory cell, the circuit comprising:

a first memory element having a control terminal, a first path terminal, and a second path terminal;

a second memory element having a control terminal, a first path terminal and a second path terminal wherein the control terminal of the second memory element is connected to the control terminal of the first memory element, and wherein the first path terminal of the second memory element is connected to the first path terminal of the first memory element;

a first selection switch having a control terminal, a first path terminal and a second path terminal wherein the first path terminal of the first selection switch is connected to a second path terminal of the first memory element, and wherein the second path terminal of the first selection switch is connected to a first address signal line such that the second path terminal of said first memory element is electrically connected to the first address signal line when said first memory element is programmed, the second path terminal of said first memory element being electrically disconnected from the first address signal line when said first memory element is read; and a second selection switch having a control terminal, a first path terminal and a second path terminal wherein the first path terminal of the second selection switch is connected to second path terminal of the second memory element, wherein the second path terminal of the second selection switch is connected to a second address signal line, and wherein the control terminal of the second selection switch is connected to the control terminal of the first selection switch such that the second path terminal of said second memory element is electrically connected to the second address signal line when said second memory element is programmed, the second path terminal of said second memory element being electrically disconnected from the second address signal line when said second memory element is read.

8. The circuit of claim 7, further comprising:

switching means for selectively coupling the control terminals of the first and second memory elements to a programming voltage so as to selectively program the first and second memory elements, the selective programming of the first and second memory elements being dependent on respective data of the first and second address signal lines.

9. The circuit of claim 7, further comprising:

switching means for selectively coupling the control terminals of the first and second memory elements to a conducting voltage so as to relay respective data of the first and second address signal lines to the second path terminals of the first and second memory elements.

10. The circuit of claim 7, further comprising:

means for providing a reference voltage to the first path terminals of the first and the second memory elements.

11. The circuit of claim 7 wherein the first address signal line carries a datum that is a complement of a datum carried on the second address signal line.

12. A circuit for programming a memory cell, the circuit comprising:

a first memory element having a control terminal, a first path terminal, and a second path terminal;

a second memory element having a control terminal, a first path terminal and a second path terminal wherein the control terminal of the second memory element is connected to the control terminal of the first memory element, and wherein the first path terminal of the second memory element is connected to the first path terminal of the first memory element;

a first selection switching having a control terminal, a first path terminal and a second path terminal wherein the first path terminal of the first selection switch is connected to a second path terminal of the first memory element, and wherein the second path terminal of the first selection switch is connected to a first data line;

a second selection switch having a control terminal, a first path terminal and a second path terminal wherein the first path terminal of the second selection switch is connected to second path terminal of the second memory element, wherein the second path terminal of the second selection switch is connected to a second data line, and wherein the control terminal of the second selection switch is connected to the control terminal of the first selection switch; and a load circuit to read information stored in the first and second memory elements, the load circuit having:

a first load switch having a control terminal, a first path terminal, and a second path terminal wherein the first path terminal of the first load switch is connected to the second path terminal of the first memory element;

a second load switch having a control terminal, a first path terminal, and a second path terminal wherein the control terminal of the second load switch is connected to the control terminal of the first load switch, and wherein the first path terminal of the second load switch is connected to the second path terminal of the second memory element;

a third load switch having a control terminal, a first path terminal, and a second path terminal wherein the control terminal of the third load switch is connected to the second path terminal of the second load switch, and wherein the first path terminal of the third load switch is connected to the second path terminal of the first load switch; and a fourth load switch having a control terminal, a first path terminal, and a second path terminal wherein the control terminal of the fourth load switch is connected to the second path terminal of the first load switch, wherein the first path terminal of the fourth load switch is connected to the second path terminal of the second load switch, and wherein the second path terminal of the fourth load switch is connected to the second path terminal of the third load switch.

13. The circuit of claim 12, further comprising:

means for supplying a bias voltage to the control terminals of the first and the second load switches.

14. The circuit of claim 12, further comprising:

means for providing a supply voltage to second path terminals of the third and the fourth load switches.

15. The circuit of claim 12 wherein the memory cell is used to store an address bit of a redundancy address.

16. The circuit of claim 7 wherein the memory cell is used to store an address bit of a redundancy address.

17. A circuit for programming a memory cell, the circuit comprising:

a first memory element having a control terminal, a first path terminal, and a second path terminal;

a second memory element having a control terminal, a first path terminal, and a second path terminal wherein the control terminal of the second memory element is connected to the control terminal of the first memory element, and wherein the first path terminal of the second memory element is connected to the first path terminal of the first memory element;

a first selection switch having a control terminal, a first path terminal, and a second path terminal wherein the first path terminal of the first selection switch is connected to the second path terminal of the first memory element, and wherein the second path terminal of the first selection switch is connected to a first data line;

a second selection switch having a control terminal, a first path terminal, and a second path terminal wherein the first path terminal of the second selection switch is connected to the second path terminal of the second memory element, wherein the second path terminal of the second selection switch is connected to a second data line, and wherein the control terminal of the second selection switch is connected to the control terminal of the first selection switch; and a load circuit to read information stored in the first and second memory elements, the load circuit having voltage limiting means for limiting voltage on the second path terminals of the first and second memory elements.

18. The circuit of claim 17 wherein said voltage limiting means comprises:

a first voltage limiting transistor having a control terminal, a first path terminal, and a second path terminal, wherein the first path terminal of the first voltage limiting transistor is connected to the second path terminal of the first memory element, the first voltage limiting transistor limiting a voltage on the second path terminal of the first memory element; and a second voltage limiting transistor having a control terminal, a first path terminal, and second path terminal, wherein the control terminal of the second voltage limiting transistor is connected to the control terminal of the first voltage limiting transistor, and wherein the first path terminal of the second voltage limiting transistor is connected to the second path terminal of the second memory element, the second voltage limiting transistor limiting a voltage on the second path terminal of the second memory element.

19. The circuit of claim 18, further comprising:

means for supplying a bias voltage to the control terminals of the first and second voltage limiting transistors, said bias voltage being suitable to limit the voltage on the second path terminals of the first and second memory elements.

20. The circuit of claim 19 wherein said load circuit further comprises:

a first load transistor having a control terminal, a first path terminal, and a second path terminal, wherein the control terminal of the first load transistor is connected to the second path terminal of the second voltage limiting transistor, and wherein the first path terminal of the first load transistor is connected to the second path terminal of the first voltage limiting transistor; and a second load transistor having a control terminal, a first path terminal, and a second path terminal, wherein the control terminal of the second load transistor is connected to the second path terminal of the first voltage limiting transistor, wherein the first path terminal of the second load transistor is connected to the second path terminal of the second voltage limiting transistor, and wherein the second path terminal of the second load transistor is connected to the second path terminal of the first load transistor.

21. The circuit of claim 20, further comprising:

means for providing a supply voltage to the second path terminals of the first and second load transistors.

22. The circuit of claim 21 integrated in a memory device, wherein the memory cell is used to store an address bit of a redundancy address.

23. The circuit of claim 22, wherein said first data line is a first address line of the memory device, and said second data line is a second address line of the memory device.

24. The circuit of claim 23, wherein said second address line is a logic complement of said first address line.

25. A circuit for programming a memory device, the circuit comprising:

a first memory element having a control terminal and first and second terminals;

a load circuit connected to the second terminal of said first memory element to read information stored in said first memory element; and a first selection switch having a control terminal and first and second terminals, the first terminal of said first selection switch being connected to the second terminal of said first memory element and the second terminal of said first selection switch being connected to a first address signal line.

26. The circuit of claim 25, further comprising:

a second memory element having a control terminal and first and second terminals, the control terminal of said second memory element being connected to the control terminal of said first memory element, the first terminal of said second memory element being connected to the first terminal of said first memory element; and a second selection switch having a control terminal and first and second terminals, the first terminal of said second selection switch being connected to the second terminal of said second memory element and the second terminal of said second selection switch being connected to a second address signal line, the control terminal of said second selection switch being connected to the control terminal of said first selection switch.

27. The circuit of claim 26 wherein said load circuit comprises:

a first load switch having a control terminal, a first terminal, and a second terminal wherein the first terminal of the first load switch is connected to the second terminal of the first memory element;

a second load switch having a control terminal, a first terminal, and a second terminal wherein the control terminal of the second load switch is connected to the control terminal of the first load switch, and wherein the first terminal of the second load switch is connected to the second terminal of the second memory element;

a third load switch having a control terminal, a first terminal, and a second terminal wherein the control terminal of the third load switch is connected to the second terminal of the second load switch, and wherein the first terminal of the third load switch is connected to the second terminal of the first load switch; and a fourth load switch having a control terminal, a first terminal, and a second terminal wherein the control terminal of the fourth load switch is connected to the second terminal of the first load switch, wherein the first terminal of the fourth load switch is connected to the second terminal of the second load switch, and wherein the second terminal of the fourth load switch is connected to the second terminal of the third load switch.

28. The circuit of claim 25 wherein said first memory element is a redundancy memory element.

29. The circuit of claim 26 wherein the information stored in said first memory element is an address bit of a defective memory cell.

30. The circuit of claim 29 wherein the information stored in said second memory element is a logical complement of the information stored in said first memory element.

31. A circuit for programming a memory device, the circuit comprising:

a first memory element for storing data having a control terminal and first and second terminals;

a load circuit connected to said second terminal of said first memory element to read information stored in said first memory element; and a first selection switch having a control terminal and first and second terminals, the first terminal of said first selection switch being connected to the second terminal of said first memory element and the second terminal of said first selection switch being connected to a first address signal line, a signal in a first state for programming that is input at the control terminal enabling the second terminal of said first memory element to be electrically connected to the first address signal line when said first memory element is being programmed and a signal in a second state for reading that is input at the control terminal enabling the second terminal of said first memory element to be electrically disconnected from the first address signal line when data stored in said first memory element is being read.

* * * * *